US008961004B2

(12) United States Patent
Srinivasan et al.

(10) Patent No.: US 8,961,004 B2
(45) Date of Patent: Feb. 24, 2015

(54) BATTERY PHASE METER TO DETERMINE INTERNAL TEMPERATURES OF LITHIUM-ION RECHARGEABLE CELLS UNDER CHARGE AND DISCHARGE

(75) Inventors: Rengaswamy Srinivasan, Ellicott City, MD (US); Michael H. Butler, Dayton, MD (US); Bliss G. Carkhuff, Laurel, MD (US); Terry E. Phillips, Ellicott City, MD (US); Jeremy D. Walker, Washington, DC (US); Oscar M. Uy, Baltimore, MD (US); Andrew C. Baisden, Silver Spring, MD (US)

(73) Assignee: The Johns Hopkins University, Baltimore, MD (US)

( * ) Notice: Subject to any disclaimer, the term of this patent is extended or adjusted under 35 U.S.C. 154(b) by 607 days.

(21) Appl. No.: 13/275,664

(22) Filed: Oct. 18, 2011

(65) Prior Publication Data
US 2012/0155507 A1 Jun. 21, 2012

Related U.S. Application Data

(60) Provisional application No. 61/394,100, filed on Oct. 18, 2010.

(51) Int. Cl.
*G01N 25/00* (2006.01)
*H01M 10/48* (2006.01)
(Continued)

(52) U.S. Cl.
CPC .............. *H01M 10/486* (2013.01); *H01M 2/34* (2013.01); *H01M 2/348* (2013.01); *G01R 31/3606* (2013.01); *G01R 31/3658* (2013.01); *H01M 10/0525* (2013.01); *H01M 2200/10* (2013.01)
USPC ............. 374/45; 374/141; 374/152; 374/163; 320/150; 320/154

(58) Field of Classification Search
CPC .............. H02J 7/0031; H02J 2007/004; H02J 2007/0037; H02J 7/0047; H02J 7/0081; H02J 7/0083; H02J 7/0086; H02J 7/008; H02J 7/0073; H02J 7/125; H02J 7/0019; H02J 7/0093; H02J 7/0091; H02J 7/0021; H02J 7/14; H02J 7/0068; H02J 7/0044; H02J 7/0042; H02J 7/0045; H02J 7/0026; H02J 7/0029; H01M 10/48; H01M 10/44; H01M 10/486; H01M 10/443; H01M 10/441; H01M 10/484; H01M 2/1022; H01M 2/34; H01M 2/348; H01M 10/0525; H01M 2200/10; H01M 10/46; G01R 31/3648; G01R 31/3627; G01R 31/3662; G01R 31/3631; G01R 31/3675; G01R 31/3606; G01R 31/3682; G01R 31/3696; G01R 31/36; G01R 31/3651; G01R 31/3658; Y02E 60/12; Y02E 60/122; Y02T 10/7005; Y02T 10/7011; G01K 1/14; G01K 7/42; G01K 1/16; G01K 7/00; Y02B 40/90
USPC .......... 374/141, 152, 163, 100; 320/142–144, 320/150–154, 114, 122, 134, 136, 156, 159, 320/161–162; 324/426, 431–432; 429/62
See application file for complete search history.

(56) References Cited

U.S. PATENT DOCUMENTS 5,537,042 A 7/1996 Beutler et al.
5,703,471 A 12/1997 Bullock et al.
(Continued)

FOREIGN PATENT DOCUMENTS

JP 11-162526 6/1999

*Primary Examiner* — Lisa Caputo
*Assistant Examiner* — Janice M Soto
(74) *Attorney, Agent, or Firm* — Noah J. Hayward

(57) ABSTRACT

Methods and systems to determine an internal temperature of a rechargeable lithium-ion cell based on a phase shift of the cell. Internal cell temperature may be determined with respect to an internal anode temperature and/or an internal cathode temperature. Internal anode temperature may be determined based on a phase shift of a frequency within a range of approximately 40 Hertz (Hz) to 500 Hz. Internal cathode temperature may be determined based on a phase shift of a frequency of up to approximately 30 Hz. A temperature sensor as disclosed herein may be powered by a monitored cell with relatively little impact on cell charge, may be electrically coupled to cell but housed physically separate from the cell, and/or may monitor multiple cells in a multiplex fashion. A rate of change in phase shift may be used to initiate pre-emptive action, without determining corresponding temperatures.

24 Claims, 10 Drawing Sheets

(51) Int. Cl.
*H01M 2/34* (2006.01)
*G01R 31/36* (2006.01)
*H01M 10/0525* (2010.01)

(56) References Cited

U.S. PATENT DOCUMENTS

| 6,002,238 | A | 12/1999 | Champlin |
| 6,025,696 | A | 2/2000 | Lenhart et al. |
| 6,437,543 | B1 | 8/2002 | Oler et al. |
| 7,059,769 | B1 | 6/2006 | Potega |
| 7,868,591 | B2 | 1/2011 | Phillips et al. |
| 7,878,242 | B2 | 2/2011 | Gray |
| 2005/0060109 | A1 | 3/2005 | Caffrey et al. |
| 2007/0090843 | A1* | 4/2007 | De Doncker et al. ......... 324/426 |
| 2009/0017364 | A1 | 1/2009 | Manev |
| 2009/0259420 | A1 | 10/2009 | Greening et al. |
| 2010/0104927 | A1 | 4/2010 | Albright |
| 2011/0216451 | A1* | 9/2011 | Haines et al. ................... 361/42 |

* cited by examiner

BATTERY PHASE METER TO DETERMINE INTERNAL TEMPERATURES OF LITHIUM-ION RECHARGEABLE CELLS UNDER CHARGE AND DISCHARGE

CROSS REFERENCE TO RELATED APPLICATIONS

This application claims the benefit of U.S. Provisional Patent Application No. 61/394,100, titled "Battery Phase Meter to Monitor the Internal Temperatures of Lithium Cells" filed Oct. 18, 2010, which is incorporated herein by reference in its entirety.

BACKGROUND

1. Technical Field

Disclosed herein are methods and systems to determine an internal temperature of a lithium-ion rechargeable cell based on a phase shift or phase delay of the cell. Also disclosed herein are methods and systems to detect a condition that may lead to thermal runaway based on a phase shift, and to initiate pre-emptive or pre-cautionary action.

2. Related Art

Excursions in the internal temperature in rechargeable lithium-ion cells may occur rapidly, within milliseconds to tens of seconds.

For example, a relatively modest but rapid elevation of internal temperature may result in damage to a solid electrolyte interface/interphase (SEI) layer, electrolyte degradation, and/or chemical decomposition within the cell. While initial damage may be heat-induced, the initial damage lead an exothermic reaction, which may result in an auto-catalytic process known as thermal runaway. For example, a sudden heat excursion may lead to initial damage in the form of a beak-down or rupture of the SIE layer. This may place an electrolyte in contact with a carbon anode, which may result in a reaction that releases additional heat and leads to thermal runaway.

Prior studies indicate that a nominally protective SEI layer may be damaged at temperatures as low as 70° C. Moreover, the time scale associated with thermal runaway is short, depending on a state-of-charge (SoC). At an ambient temperature of approximately 25° C. and 100% SoC, thermal runaway may occur within a few seconds, whereas at less than 50% SoC, thermal runaway may occur over tens of seconds.

Conventional surface-mounted temperature sensors do not adequately track internal temperature changes, regardless of a sampling rate used to digitize sensor output. This is because surface mounted temperature is a low-pass-filtered reflection of internal temperature. In other words, surface-mounted temperatures sensors do not reflect fast changes in internal temperature, such as changes over less than a few seconds. Conventional surface-mounted temperatures are thus inadequate to detect or predict thermal runaway.

SUMMARY

Disclosed herein are methods and systems to determine internal temperature of a rechargeable lithium-ion directly from internal features of the cell. Methods and systems disclosed herein may thus be responsive to internal temperature changes orders of magnitude faster than a thermocouple.

Methods and systems disclosed herein and may be implemented external of the cell and physically separated from a cell, through wire connections to cathode and anode terminals of the cell.

Also disclosed herein are methods and systems to measure a phase delay, which may be attributable to impedance of a protective layer that is constantly present on the anode and cathode surfaces. If the protective layer becomes weak, damaged or begins to fail, a sensor as disclosed herein may instantaneously sense and report the failure before the damaged layer initiates a thermal runaway. The report may be provided several seconds before a surface of the cell begins to heat up, which may be sufficient to permit the cell to be disconnected from a load and/or charger before thermal runaway occurs. The report may be provided before a surface-mounted sensor would have detected the heat.

A temperature sensor as disclosed herein may be implemented within a relatively small space to monitor multiple cells in a battery pack through multiplexing. Multiplexing may be used to monitoring every cell in a multi-cell pack, which is may be too cumbersome and/or expensive to implement with surface-mounted thermocouples.

BRIEF DESCRIPTION OF THE DRAWINGS/FIGURES

Figure 1:
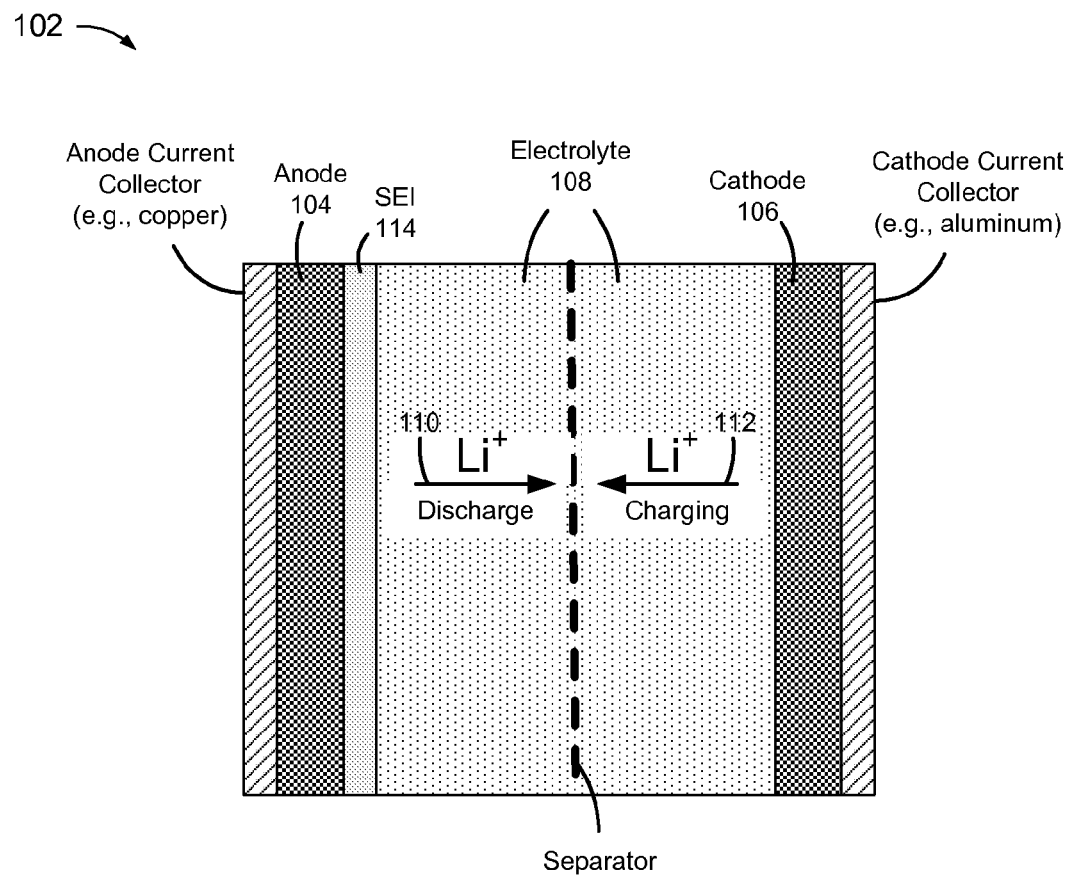
FIG. 1 is a block diagram of a lithium-ion cell.

In the drawings, the leftmost digit(s) of a reference number identifies the drawing in which the reference number first appears.

DETAILED DESCRIPTION

FIG. 1 is a block diagram of a lithium-ion cell 102, including electrodes 104 and 106, and an electrolyte 108 to provide a conducting medium between electrodes 104 and 106. In FIG. 1, electrode 104 is illustrated as an anode 104, and electrode 106 is illustrated as a cathode 106.

Rechargeable, or secondary lithium-ion cell chemistry is based on intercalation and de-intercalation, or insertion and extraction of lithium ions into and out of open crystalline or amorphous structures, or lattices of anode 104 and cathode 106.

Electrolyte 108 may include a non-aqueous organic lithium salt dissolved in an organic solvent, and electrodes 104 and 106 may be fabricated from materials for which lithium ions can migrate into and out of. Such electrodes are called intercalation hosts.

Anode 104 made include carbon, such as graphite or crystalline or amorphous silicon or alloys of silicon with elements such as gallium.

Cathode 106 may include a metal oxide, such as, without limitation, lithium cobalt dioxide, lithium manganese dioxide, lithium nickel oxide, or a mixture of several metal oxides.

Cathode 106 may include a layered oxide, such as lithium cobalt oxide, a polyanion, such as lithium iron phosphase, or a spinel, such as lithium manganese oxide.

Cathode 106 may be coated with a relatively thin but stable layer of carbon, aluminum oxide, tungsten oxide or titanium oxide to prevent electrolyte 108 and an associated electrolyte solvent from reacting with cathode 106.

When discharging, lithium ions extract from anode 104, migrate across electrolyte 108, and insert into cathode 106, as illustrated by an arrow 110. Compensating electrons travel through an external load and are accepted by anode 104 to balance the reaction. When charging, lithium ions are extracted from cathode 106, migrate across electrolyte 108, and insert anode 104, as illustrated by an arrow 112.

By convention, current is defined as traveling in the opposite direction of electron travel. Anode 104 may be referred to as a negative electrode, and cathode 106 may be referred to as a positive electrode.

During an initial, or formation charge of cell 102, electrolyte 108 may react with carbon anode 104 during, which may cause a relatively thin protective solid electrolyte interface/interphase (SEI) layer 114 to develop. SEI layer 114 may or increases an internal impedance of cell 102, restrict or moderate charge flow between cathode 106 and anode 104, and may impact high and/or low temperature performance.

The metal oxide cathode 106 may have a relatively thin protective layer of carbon, aluminum oxide, tungsten oxide or titanium oxide to prevent the cathode from reacting with the electrolyte and the electrolyte solvent. The protective carbon or the oxide layer may or increases an internal impedance of cell 102, restrict or moderate charge flow between cathode 106 and anode 104, and may impact high and/or low temperature performance.

Further to the discussion above regarding potential heat-related damage, a sudden heat excursion within cell 102 may lead to break-down and/or rupture of SEI layer 114, or the protective layer on the cathode 106, which may place electrolyte 108 and carbon anode 104 and the electrolyte 108 and cathode 106 in contact with one another, which may restart the reaction described above, which may release additional heat and lead to thermal runaway.

It is known that impedance due to SEI layer 114 and the protective layer on the cathode 106 are substantially independent of the state-of-charge (SoC) of cell 102.

It is also known that impedance due to SEI layer 114 and the protective layer on the cathode 106 are predominately dependent upon, or a function of the internal temperature of cell 102. In other words, impedance due to SEI layer 114 and the protective layer on the cathode 106 change with internal cell temperature.

Disclosed herein are methods and systems to determine an internal temperature of a lithium-ion cell based on a phase delay of the cell. The phase delay may be a function of the impedance of the cell in that the phase delay may be directly or indirectly related to the impedance, but is not a measure of the cell impedance. Internal cell temperature may be determined substantially instantaneously based on a phase delay at a given instance in time.

As described below with reference to FIG. 2, a lithium-ion cell may be evaluated to correlate a phase delay with an internal cell temperature, for a range of temperatures.

The correlations may be used to determine an internal temperature of the cell and/or another cell, based on a phase delay of the cell, such as described below with reference to FIG. 3.

Phase delay may be measured or detected as a phase difference between a frequency of an alternating signal applied to the cell and a frequency of a phase-shifted alternating signal generated at the cell in response to the applied signal.

The applied signal may include an alternating current and the phase-shifted signal may include an alternating voltage. Alternatively, the applied signal may include an alternating voltage and the phase-shifted signal may include an alternating current. Examples are provided below with respect to alternating currents applied to a cell. Methods and systems disclosed herein are not, however, to application of an alternating current.

An externally-generated alternating current may be applied to cell 102 to generate an alternating voltage at or between cathode 106 and anode 104. The impedance of cell 102 may impart a phase shift to a frequency of the alternating voltage, relative to a frequency of the alternating current.

Figure 2:
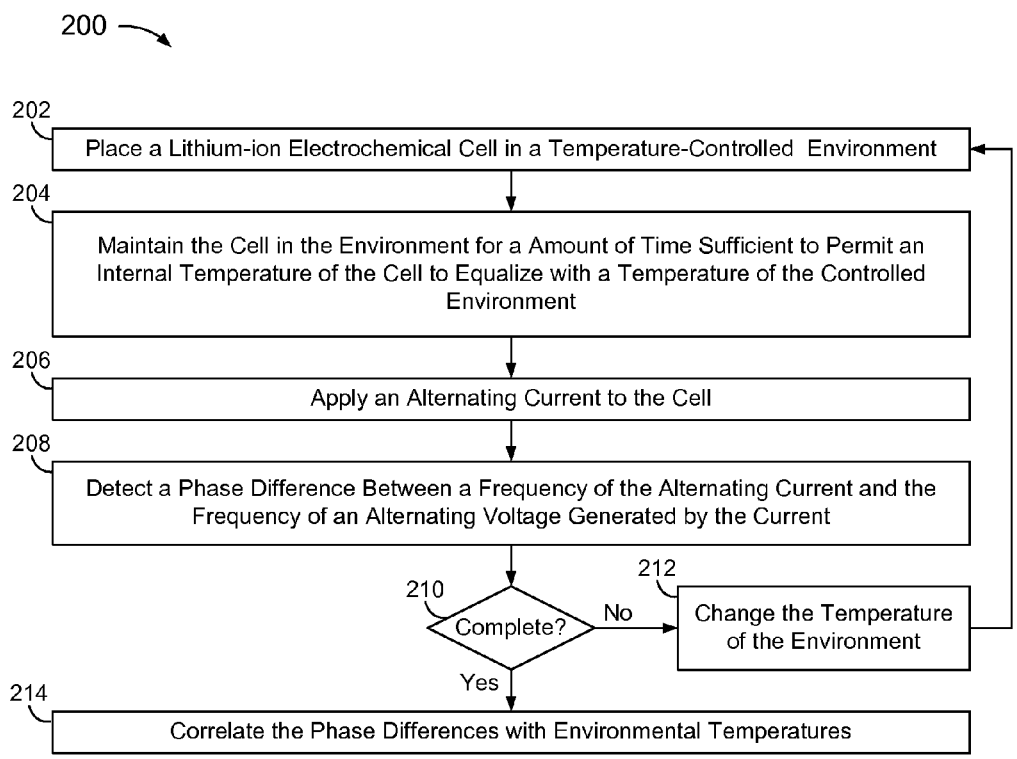
FIG. 2 is a flowchart of a method of correlating a phase delay of a lithium-ion cell with a corresponding internal temperature of the cell, for a range of temperatures.

FIG. 2 is a flowchart of a method 200 of correlating a phase shift of a lithium-ion cell with a corresponding internal temperature of the cell, for a range of temperatures.

At 202, a lithium-ion cell is placed in a temperature-controlled environment.

At 204, the cell is maintained in the temperature-controlled environment for a time sufficient to permit an internal temperature of the cell to equalize with a temperature of the environment.

At 206, after the amount of time at 204, an alternating, or sinusoidal current is applied to the cell. The alternating current results in an alternating voltage across a cathode and anode of the cell.

At 208, a phase shift is detected as a difference between a frequency of the alternating current and a frequency of the alternating voltage.

At 210, where a phase shift is to be detected for another temperature, processing proceeds to 212 where the temperature of the environment is changed. Processing then returns to 202.

At 214, the detected phase shifts and corresponding environmental temperatures are correlated. The correlating may include interpolating between phase shifts detected at 210 and corresponding environmental temperatures, such as to provide a continuous correlation over a range of temperature.

The correlations generated at 214 may be used to determine an internal temperature of a lithium-ion cell based on a phase delay of the cell, such as described below with reference to FIG. 3.

Figure 3:
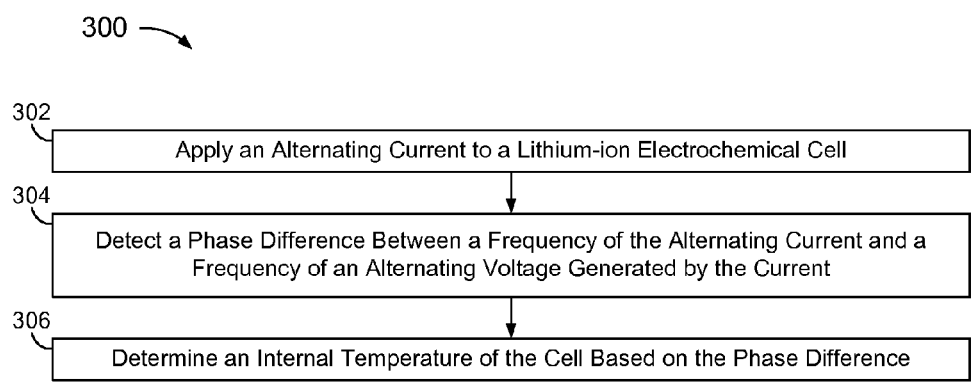
FIG. 3 is a flowchart of a method of determining an internal temperature of a lithium-ion cell based on a phase delay of the cell.

FIG. 3 is a flowchart of a method 300 of determining an internal temperature of a lithium-ion cell based on a phase delay of the cell.

At 302, an alternating current is applied to a lithium-ion cell to generate an alternating voltage across cathode and anode terminals of the cell, such as described above with respect to 206.

At 304, a phase difference between a frequency of the alternating current and a frequency of the alternating voltage is detected.

At 306, an internal temperature of the cell is determined based on the phase difference.

The determining at 306 may include referencing the correlations of 214 in FIG. 2, which may be provided in look-up table.

A lithium-ion cell, such as cell 102 in FIG. 1, may exhibit multiple frequency-dependent impedance domains. Example frequency domains are provided below. Methods and systems disclosed herein are not, however, limited to the examples below. Frequency ranges may vary based on characteristics of an SEI layer and/or the protective layer on the anode and the cathode.

A first frequency-dependent impedance domain may include a capacitive reactance between approximately 40 Hertz (Hz) and 500 Hz, which may be attributable to a graphite anode impedance and, more particularly, to the impedance of SEI layer 114 on anode 104. In this frequency domain, impedance of cell 102 may be predominantly anode impedance.

A second frequency-dependent impedance domain may include a capacitive reactance between approximately 1 Hz and 30 Hz, which may be attributable to the impedance of SEI layer 114 on cathode 106. In this frequency domain, impedance of cell 102 may be predominantly cathode impedance.

Method 200 and/or method 300 may be performed with respect to one or more frequency-dependent impedance domains.

For example, method 200 and/or method 300 may be performed with respect to a frequency within a range of approximately 40 Hz to 500 Hz to measure an internal cell temperature as a function of SEI layer impedance on a anode. Such a temperature is referred to herein as $T_{anode}$.

Similarly, method 200 and/or method 300 may be performed with respect to a frequency within a range of approximately 10 Hz to 30 Hz to measure an internal cell temperature as a function of SEI layer impedance on a cathode. Such a temperature is referred to herein as $T_{cathode}$.

Method 200 and/or method 300 may be performed with respect to $T_{anode}$ and $T_{cathode}$. For example, multiple alternating currents may be applied to cell 102, sequentially or concurrently, and phase shifts may be detected with respect to each of the currents. Where multiple currents are applied concurrently, frequencies of alternating voltage frequencies may be separated with frequency filtering.

Example systems to correlate phase shifts with internal cell temperatures, and to determine an internal cell temperature based on the correlations, are disclosed below with reference to FIGS. 4-7.

Figure 4:
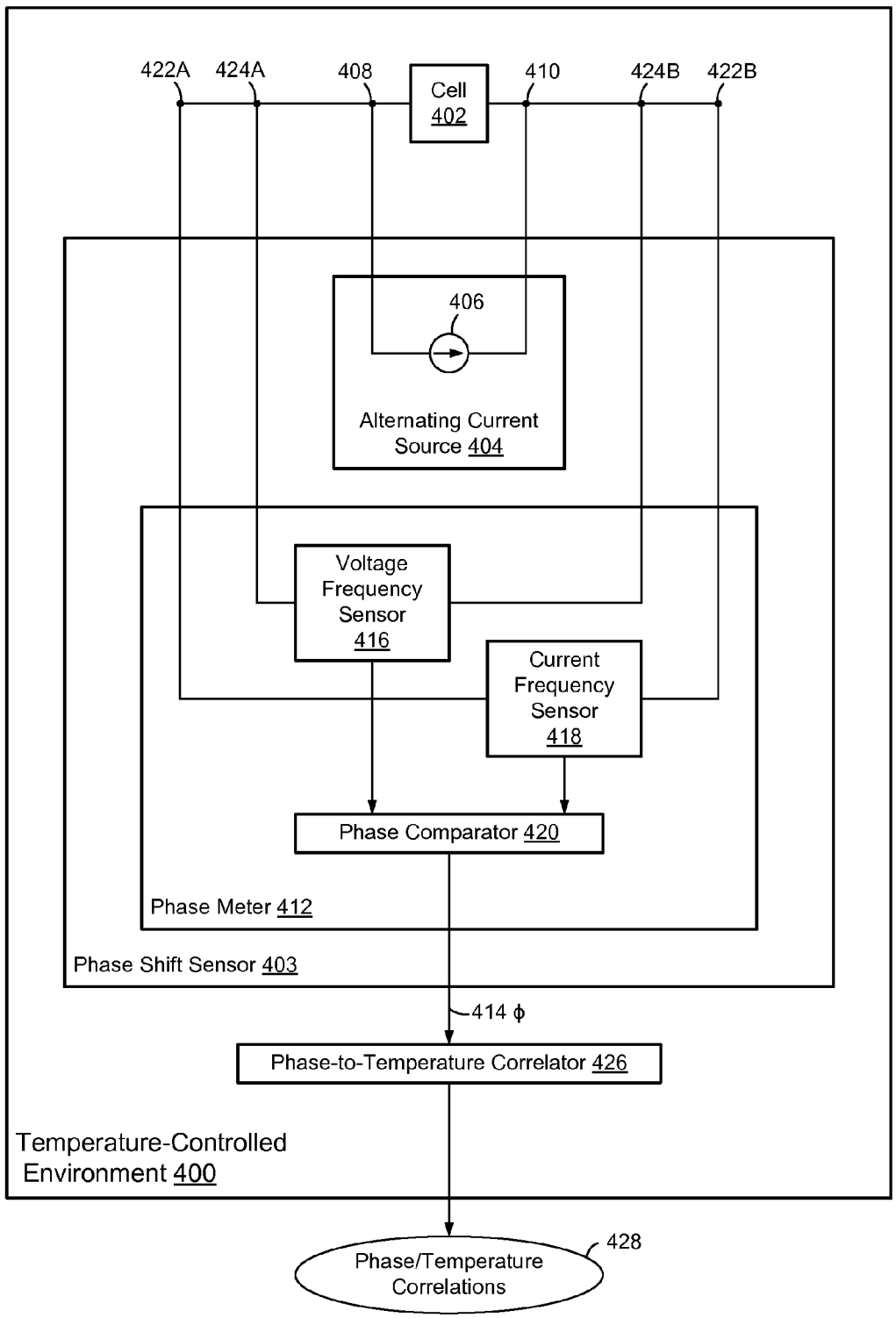
FIG. 4 is a block diagram of a system to correlate a phase delay of a lithium-ion cell with an internal temperature of the cell, for a range of temperatures.

FIG. 4 is a block diagram of a temperature-controlled environment 400, including a phase shift sensor 403 to detect phase shifts 414 and a phase-to-temperature correlator 426 to correlate phase shifts 414 with temperatures of environment 400.

Cell 402 includes an anode terminal 408 and a cathode terminal 410, each in electrical contact with a corresponding anode and cathode of cell 402.

Phase shift sensor 403 may include an alternating or sinusoidal current source 404 to apply an alternating current 406 to cell 402.

Current source 404 may be implemented to apply current 406 to cell 402 while cell 402 is discharging and/or charging. Current source 404 may be implemented to direct current 406 into cathode terminal 408 and/or anode terminal 406.

When current 406 is applied to cell 402, a corresponding alternating voltage is generated at, or across terminals 408 and 410

Phase shift sensor 403 may include a phase meter 412 to detect a phase difference 414 between a frequency of current 406 and a frequency of the alternating voltage.

Phase shift sensor 403 may include a voltage source instead of, or in addition to current source 404, and phase meter 412 may be implemented to detect phase difference 414 with respect to an applied voltage and a resultant current, such as described further above.

In the example of FIG. 4, phase meter 412 includes four probes, including current frequency probes 422A and 422B, and voltage frequency probes 424A and 424B.

Phase meter 412 may include an electrochemical interface potentiostat/galvanostat, and a frequency response analyzer, and/or portions thereof sufficient to detect phase difference 410.

For illustrative purposes, phase meter 412 is functionally illustrated in FIG. 4 as including a voltage frequency sensor 416 to determine a frequency of the alternating voltage, a current frequency sensor 418 to determine a frequency of current 406, and a phase comparator 420 to determine a phase difference between the frequencies of alternating current 406 and the alternating voltage.

Phase-to-temperature correlator 426 may output phase-shift/temperature correlations 428, which may be used to calibrate a temperature sensor, such as described below with reference to one of more of FIGS. 5-7.

Correlations 428 may be recorded in a tangible medium, which may include a computer-readable tangible medium and/or circuitry. Correlations 428 may be recorded, for example, in a data structure, such as a look-up table.

Phase-to-temperature correlator 426 may be implemented to interpolate between, and/or extrapolate from phase shifts 414 and corresponding environmental temperatures, such as to provide correlations for a continuous range of phase shift and temperature.

In FIG. 4, current source 404 may be implemented with respect to a frequency-dependent impedance domain of cell 402. For example, current source 404 may generate alternating current 406 within a range of approximately 40 Hz to 100 Hz to correlate phase shifts 414 with $T_{anode}$, or within a range of approximately 10 Hz to 20 Hz to correlate phase shifts 414 with $T_{cathode}$.

Current source 404 may be configurable, or programmable to control the frequency of current 406. A programmable current source 404 may be programmed to operate at a selected frequency, and/or to switch between multiple frequencies, such as to correlate phase shifts 414 with $T_{anode}$ and $T_{cathode}$. Alternatively, multiple current sources may be utilized to provide multiple current frequencies to cell 402, such as described below with reference to FIG. 6.

Figure 5:
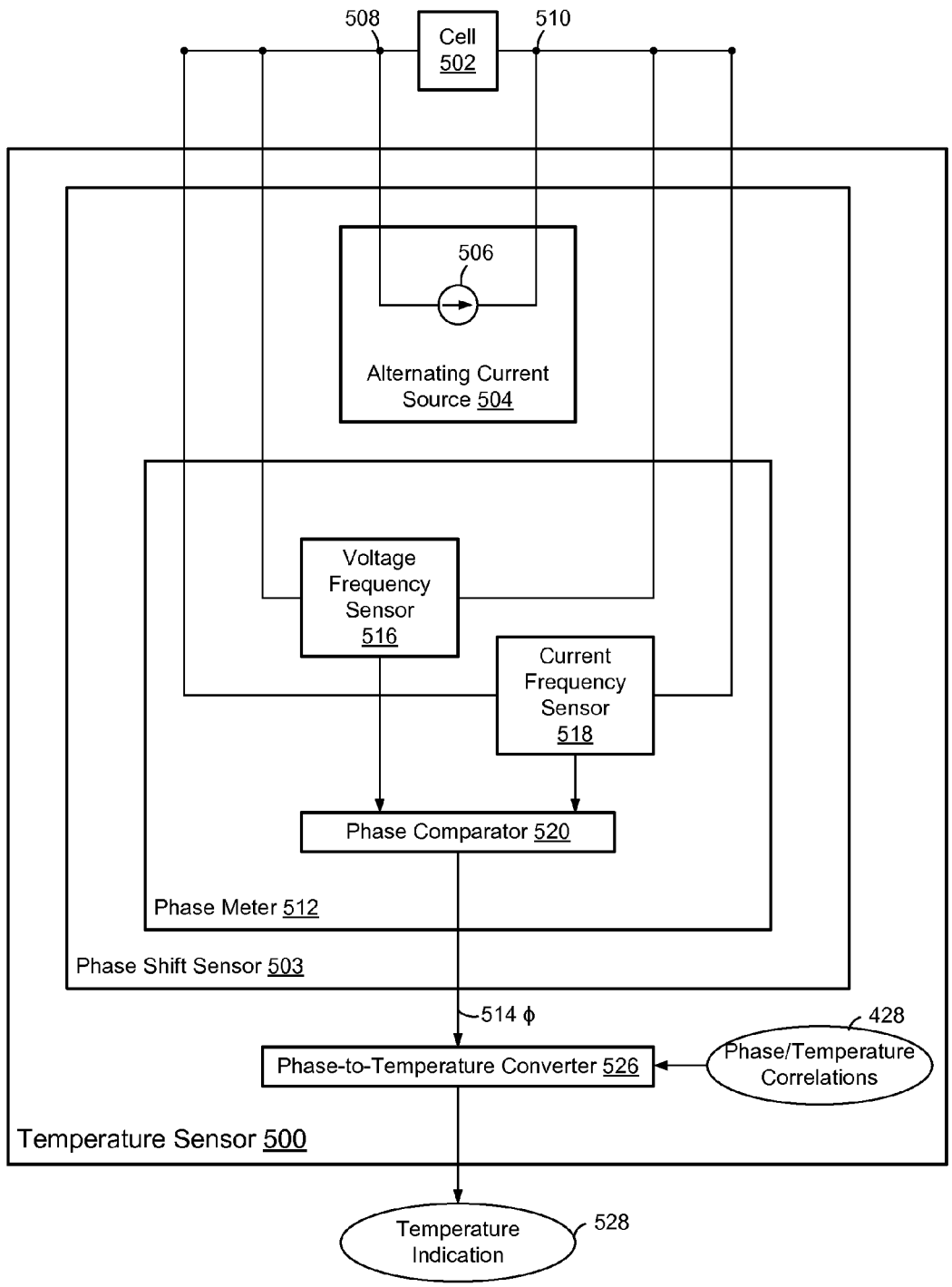
FIG. 5 is a block diagram of a temperature sensor to determine an internal temperature of a lithium-ion cell based on a phase-delay of the cell.

FIG. 5 is a block diagram of a temperature sensor 500 to determine an internal temperature of a lithium-ion cell 502 based on a phase-shift of cell 502.

Cell 502 includes an anode terminal 508 and a cathode terminal 510, each in electrical contact with a corresponding anode and a cathode of cell 502.

Temperature sensor 500 includes a phase shift sensor 503 to sense a phase shift imparted by impedance of cell 502, such as described above with respect to phase shift sensor 403 in FIG. 4.

Phase shift sensor 503 may include an alternating or sinusoidal current source 504 to apply an alternating current 506 to cell 502, such as described above with respect to current source 404 in FIG. 4.

Phase shift sensor 503 may include a phase meter 512 to detect a phase difference 514 between a frequency of current 506 and a frequency of a corresponding alternating voltage, such as described above with respect to phase meter 412 in FIG. 4

Temperature sensor 500 may further include a phase-to-temperature converter 526 to convert phase indication 514 to a temperature indication 528, based on correlations 428.

Converter 522 may be implemented to interpolate between, and/or extrapolate from, phase shifts and corresponding temperatures of correlations 428, such as where phase shift 514 is not identical to a phase shift in correlations 428.

Converter 522 may be implemented to output temperature indication 524 as a digital and/or analog value.

Converter 522 may be implemented to output temperature indication 524 as a measure of temperature, such as in degrees C., and/or as a relative indication, such as relative to one or more threshold values.

Temperature indication 524 may be provided to a display and/or to another system, such as a monitor and/or control system.

Temperature sensor 500 may be implemented to continuously measure the internal temperature of cell 502, or periodically sample the internal temperature of cell 502.

Current source 504 may be implemented with respect to one or more a frequency-dependent impedance domains of cell 502, such as described above with reference to FIG. 4.

Figure 6:
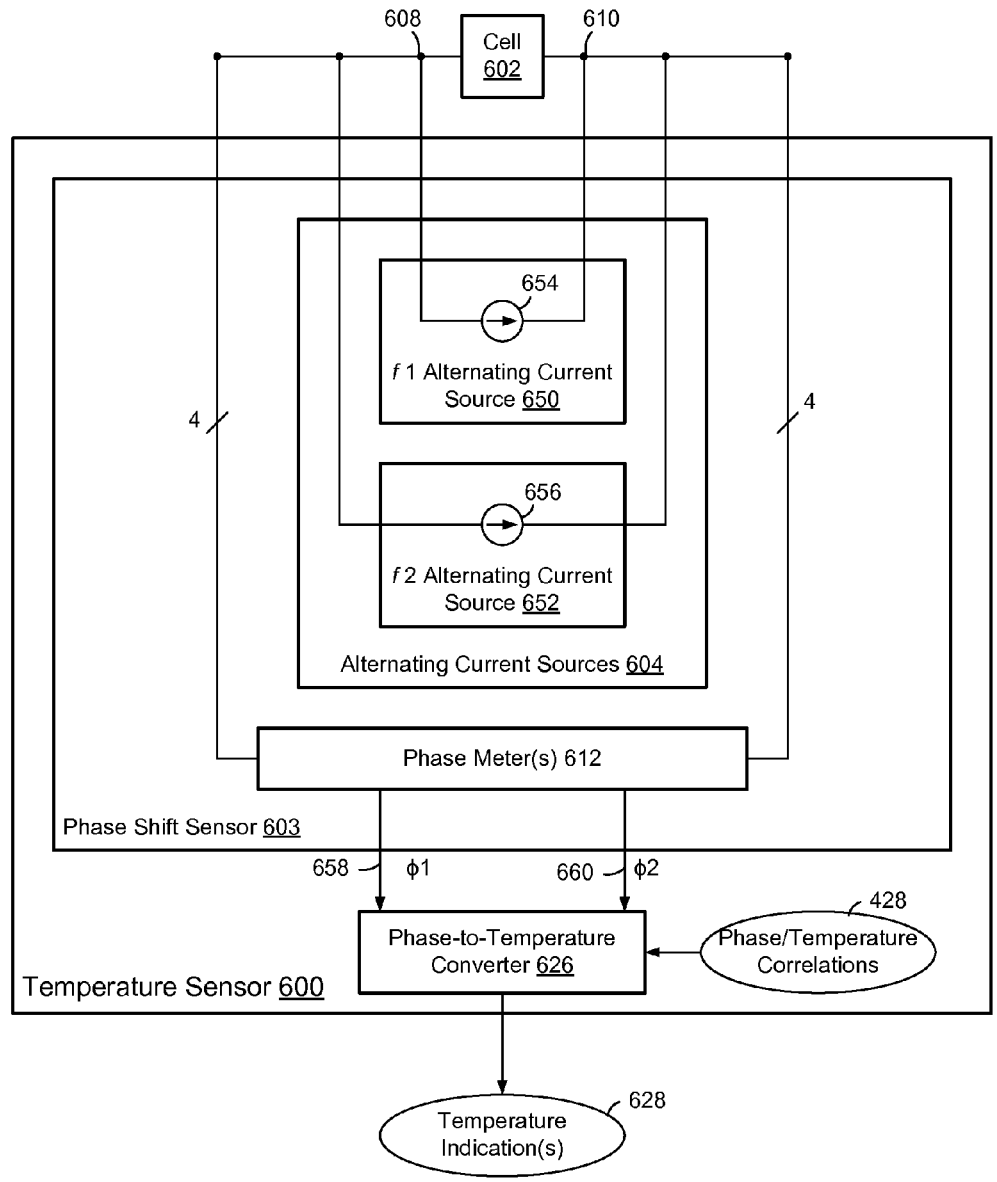
FIG. 6 is a block diagram of a temperature sensor to determine internal anode and cathode temperatures of a lithium-ion cell, based on phase delays attributable to corresponding frequency-dependent impedance domains of the cell.

FIG. 6 is a block diagram of a temperature sensor 600 to determine internal temperatures $T_{anode}$ and $T_{cathode}$ of a lithium-ion cell 602, based on corresponding frequency-dependent impedance domains of cell 602.

Cell 602 includes an anode terminal 608 and a cathode terminal 610, each in electrical contact with a corresponding anode and cathode of cell 602.

Temperature sensor 600 includes a phase shift sensor 603 to sense phase shifts due to an impedance of cell 602.

Phase shift sensor 603 may include multiple alternating or sinusoidal current sources 604, each to apply a corresponding alternating current to cell 602. The multiple currents may be applied consecutively and/or concurrently. In FIG. 6, current sources 604 include first and second current sources 650 and 652, each to generate a corresponding one of currents 654 and 656. Current 654 may have a frequency within a range of approximately 40 Hz to 100 Hz, and current 656 may have a frequency within a range of approximately 20 Hz to 30 Hz.

Temperature sensor 600 further includes a phase meter 612 to detect first and second phase differences 658 and 660, based on alternating currents generated by currents 654 and 656, and corresponding alternating voltage frequencies.

Phase meter 612 may be implemented similar to phase meter 412 in FIG. 4 and/or phase meter 512 in FIG. 5.

Temperature sensor 600 may include a phase-to-temperature converter 626 to convert phase indications 658 and 660 to one or more temperature indications 628, such as described above with respect to converter 526 in FIG. 5.

Converter 626 may be implemented to output a corresponding temperature indication for each of phase indications 658 and 660, and/or to combine and convert phase indications 658 and 660 to a single temperature indication.

Temperature sensor 600 may be implemented to continuously measure the internal temperature of cell 602, or periodically sample the internal temperature of cell 602.

A temperature sensor as disclosed herein may be implemented to measure internal temperatures of multiple lithium-ion cells, such as described below with reference to FIG. 7.

Figure 7:
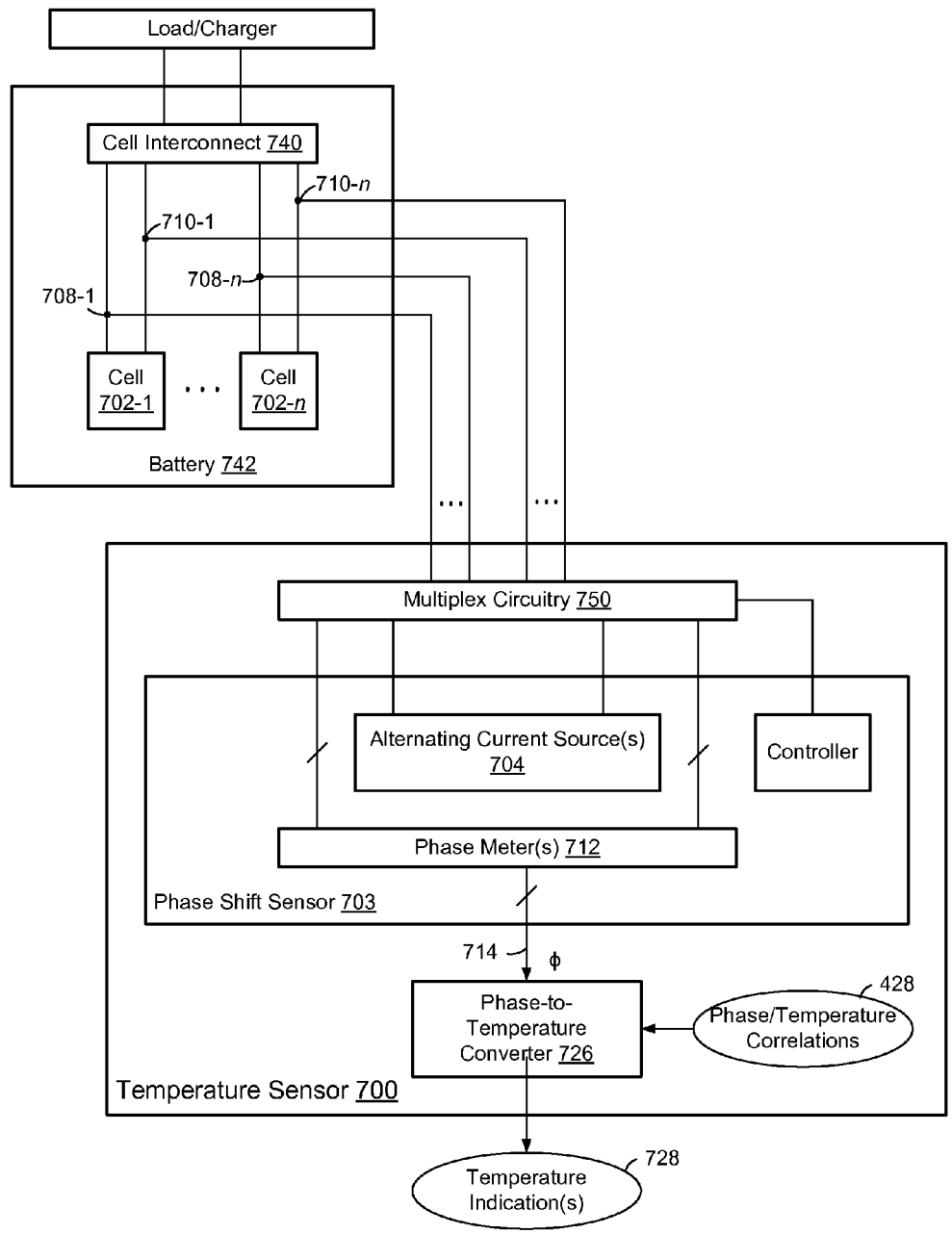
FIG. 7 is a block diagram of a temperature sensor to determine internal temperatures of multiple lithium-ion cells, based on phase delays of the corresponding cells.

FIG. 7 is a block diagram of a temperature sensor 700 to determine internal temperatures of multiple lithium-ion cells 702-1 through 702-n, based on phase-shifts of the corresponding cells.

Each of cells 702-1 through 702-n includes a corresponding anode terminal 708 and a cathode terminal 710.

Cells 702-1 through 702-n may be interconnected with a cell interconnect structure 740, which may include a serial and/or parallel interconnect structure. Interconnect structure 740 may be implemented to selectively disconnect one or more of cells, such as in response to an indication of an over-heating condition within the corresponding cell.

Cells 702-1 through 702-n may be implemented as a battery 740, which may include one or more additional sets of cells. Each set of cells may be monitored by a corresponding temperature sensor 700.

Temperature sensor 700 includes a phase shift sensor 703 to detect phase shifts 714 with respect to each of cells 702-1 through 702-n, such as described in one or more examples above.

Temperature sensor 700 may include multiplex circuitry 750 to selectively connect current sources 704 to a one of cells 702-1 through 702-n, and to concurrently connect probes of a phase meter 712 to a corresponding one of cells 702-1 through 702-n.

Temperature sensor 700 further includes a phase-to-temperature converter 726 to convert phase shifts 714 to temperature indications 728, such as described in one or more examples above.

Temperature sensor 700 may be implemented to determine internal temperatures of cells 702-1 through 702-n in a consecutive fashion.

In an embodiment, phase shift of a cell may be monitored over time, continuously or periodically, and pre-emptive or precautionary action may be initiated or invoked when a rate of change of the phase shift meets or exceeds a threshold rate. The phase shift may be determined as a phase difference, such as disclosed in one or more examples herein.

Pre-emptive or precautionary action may be initiated without determining an internal temperature of the cell (i.e., without converting a phase difference to a temperature), and may be implemented without calibrated phase-shift-to-temperature correlations.

The threshold rate may correspond to a rate of change associated with a thermal runaway condition, and/or a rate of change associated with a condition that may lead to thermal runaway. The threshold rate may be determined experimentally and/or based on operating history or experience.

Pre-emptive action may include issuing an alert and/or isolating the cell from one or more of a charging circuit and a discharging circuit. The pre-emptive action may be initiated prior to a thermal runaway condition, and may be initiated to preclude or reduce a degree of thermal runaway.

Experimental Results

A 4.3 Amp-hour (Ah) lithium-ion electrochemical cell was evaluated under dynamic conditions of charge and discharge, over a temperature range of −20° C. to 66° C.

The evaluation collecting phase shift data as described above with respect to method 300, at each of multiple temperatures, and validating the data as described above with respect to method 200.

During data collection, the cell was housed within an environmental chamber to equalize the internal temperature of the cell with the environmental temperature. A battery testing system was used for charging and discharging the cell.

First and second sinusoidal currents were applied to the cell, each having a frequency within a corresponding one of ranges 40 Hz to 100 Hz and 10 Hz to 20 Hz.

Phase shifts were measured at each of multiple temperatures, using an electrochemical interface potentiostat/galvanostat and a frequency response analyzer.

Phase shifts of the first sinusoidal current were correlated with corresponding environmental temperatures as $T_{anode}$.

Phase shifts of the second sinusoidal current were correlated with corresponding environmental temperatures as $T_{cathode}$.

Phase shifts were collected at various states-of-charge (SoC), and various environmental/internal cell temperatures over the −20° C. to 66° C. range.

Figure 8:
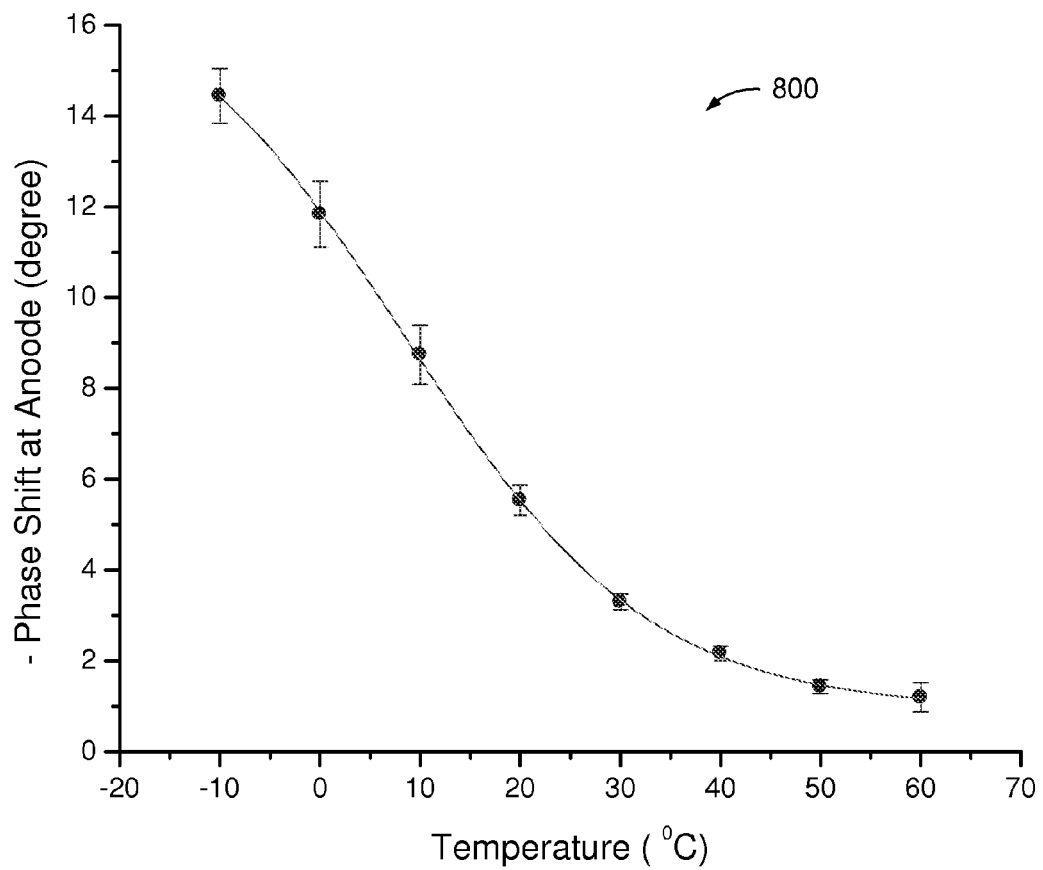
FIG. 8 is graph of phase shift versus anode temperature of a lithium-ion cell, at a 50% state-of-charge (SoC), under discharge conditions.

FIG. 8 is graph 800 of phase shift versus temperature for $T_{anode}$ at 50% SoC, under discharge.

Figure 9:
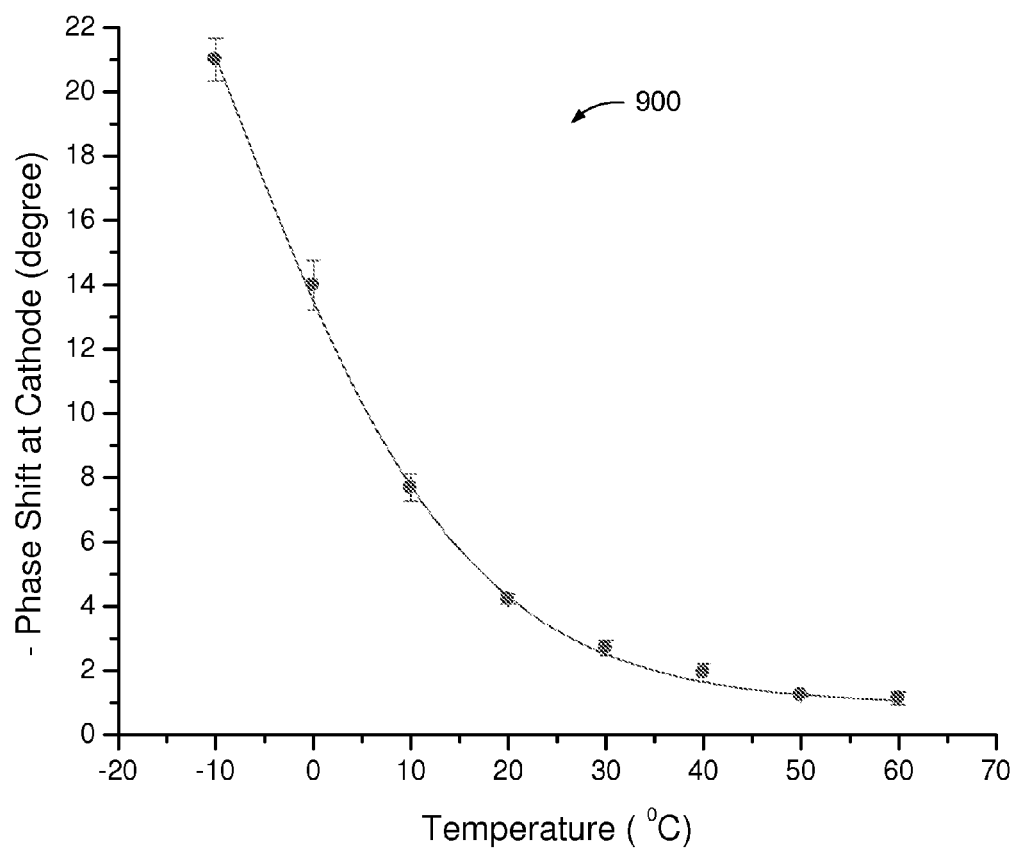
FIG. 9 is graph of phase shift versus cathode temperature of a lithium-ion cell, at a 50% state-of-charge (SoC), under discharge conditions.
Figure 11:
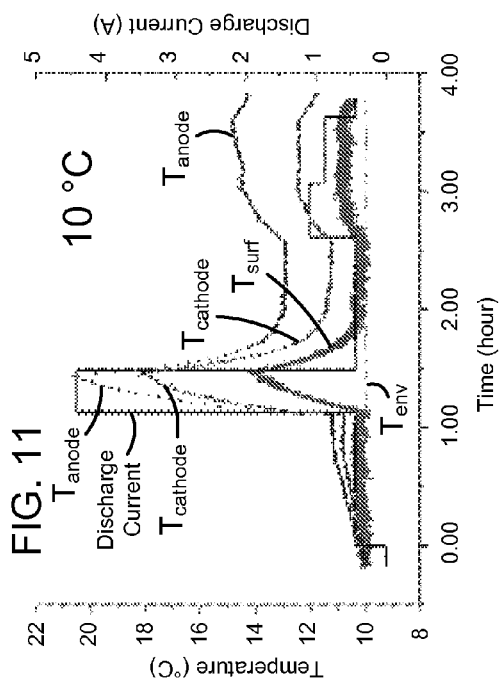
FIG. 11 is graph of validation data for an environmental temperature of 10° C.
Figure 13:
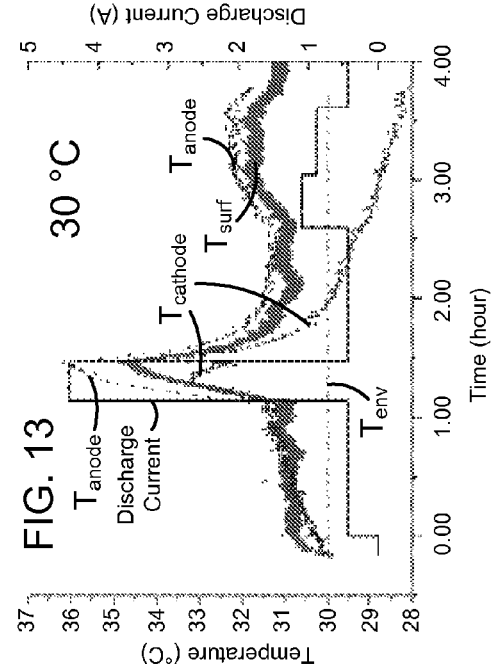
FIG. 13 is graph of validation data for an environmental temperature of 30° C.
Figure 10:
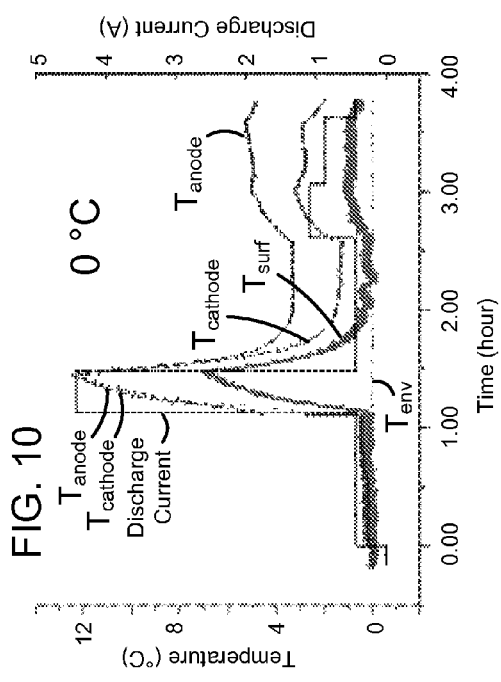
FIG. 10 is graph of validation data for an environmental temperature of 0° C.
Figure 12:
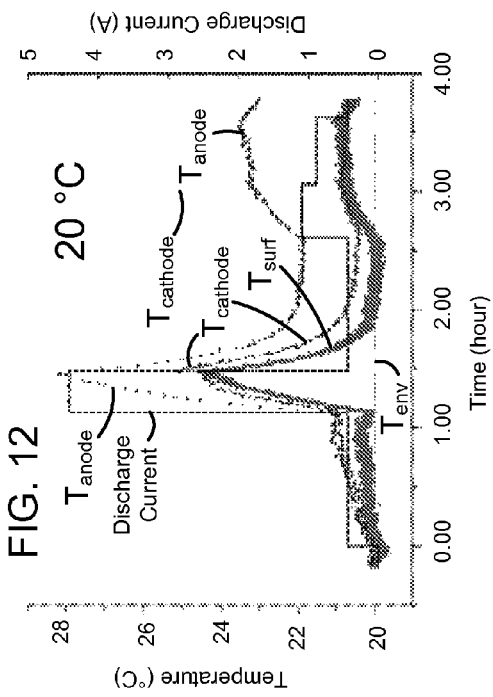
FIG. 12 is graph of validation data for an environmental temperature of 20° C.

FIG. 9 is graph 900 of phase shift versus temperature for $T_{cathode}$ at 50% SoC, under discharge.

$T_{anode}$ and $T_{cathode}$ calibration data was then validated at various temperatures. Prior to each validation procedure, the cell was placed in the environmental chamber to equalize the internal temperature of the cell with the environmental temperature.

The battery testing system was used for charging and discharging the cell, and a K-type thermocouple was mounted to an outer surface of the cell to monitor surface temperature, $T_{surf}$, of the cell.

At each environmental temperature, first and second sinusoidal currents were applied to the cell, each current having a frequency within a corresponding one of ranges 40 Hz to 100 Hz and 10 Hz to 20 Hz. Phase shift data was collected, and surface temperatures were recorded as the discharge rate was varied in steps to alter the internal temperature of the cell.

The phase shift data was then converted to temperatures $T_{anode}$ and $T_{cathode}$ based on the correlations, such as illustrated in FIGS. 8 and 9.

FIGS. 10 through 13 are graphs of validation data associated with respective environmental chamber temperatures of 0° C., 10° C., 20° C., and 30° C.

FIGS. 10 through 13 each include environmental chamber temperature, $T_{env}$, anode temperature $T_{anode}$, cathode temperature $T_{cathode}$, cell surface temperature $T_{surf}$ and discharge current. The horizontal axes represent time in hours, the vertical axes on the right correspond to the discharge current, and the vertical axes on the left correspond to temperatures $T_{env}$, $T_{anode}$, $T_{cathode}$, and $T_{surf}$.

FIGS. 10 through 13 illustrate that $T_{surf}$, $T_{anode}$, and $T_{cathode}$ vary with the discharge current, and thus correspond to internal cell temperatures.

FIGS. 10 through 13 illustrate that magnitudes of the changes in $T_{surf}$, $T_{anode}$, and $T_{cathode}$ depends to some extent on $T_{env}$.

FIGS. 10 through 13 further illustrate that $T_{anode}$ and $T_{cathode}$ respond more quickly to changes in the discharge current than $T_{surf}$ which confirms that $T_{anode}$ and $T_{cathode}$ respond more quickly to internal cell temperature.

FIGS. 10 through 13 further illustrate that $T_{anode}$ and $T_{cathode}$ tend to be higher than the surface temperature $T_{surf}$ which is likely due to insulation provided by the cell housing and/or other factors.

FIGS. 11 through 14 further illustrate that $T_{anode}$ tends to be higher than $T_{cathode}$.

The evaluation data thus demonstrates that phase-shift based temperature determinations reliably and rapidly track dynamic changes in $T_{anode}$ and $T_{cathode}$ temperatures of a 4.4-Ah cell under charge and discharge across various environment temperatures.

Related evaluations have been performed with respect to other lithium-ion cells, including a 51 Ah cell.

Additional experimental results are provided in R. Srinivasan, et al., "Instantaneous Measurement of the Internal Temperature in Lithium-ion Rechargeable Cells," Elsevier, Electrochimica Acta, Vol. 56, pp. 6198-6204 (2001), which is incorporated herein by reference in its entirety, including references cited therein.

Evaluations of various lithium-ion cells and sensors indicate that phase-to-temperature correlations obtained from a lithium-ion cell may be reliably used to determine internal temperatures of other lithium-ion cells from phase shifts detected in the corresponding other cells, including cells within a range of 4.3 Ah and 51 Ah, and cells of different manufacturers and/or models.

Figure 14:
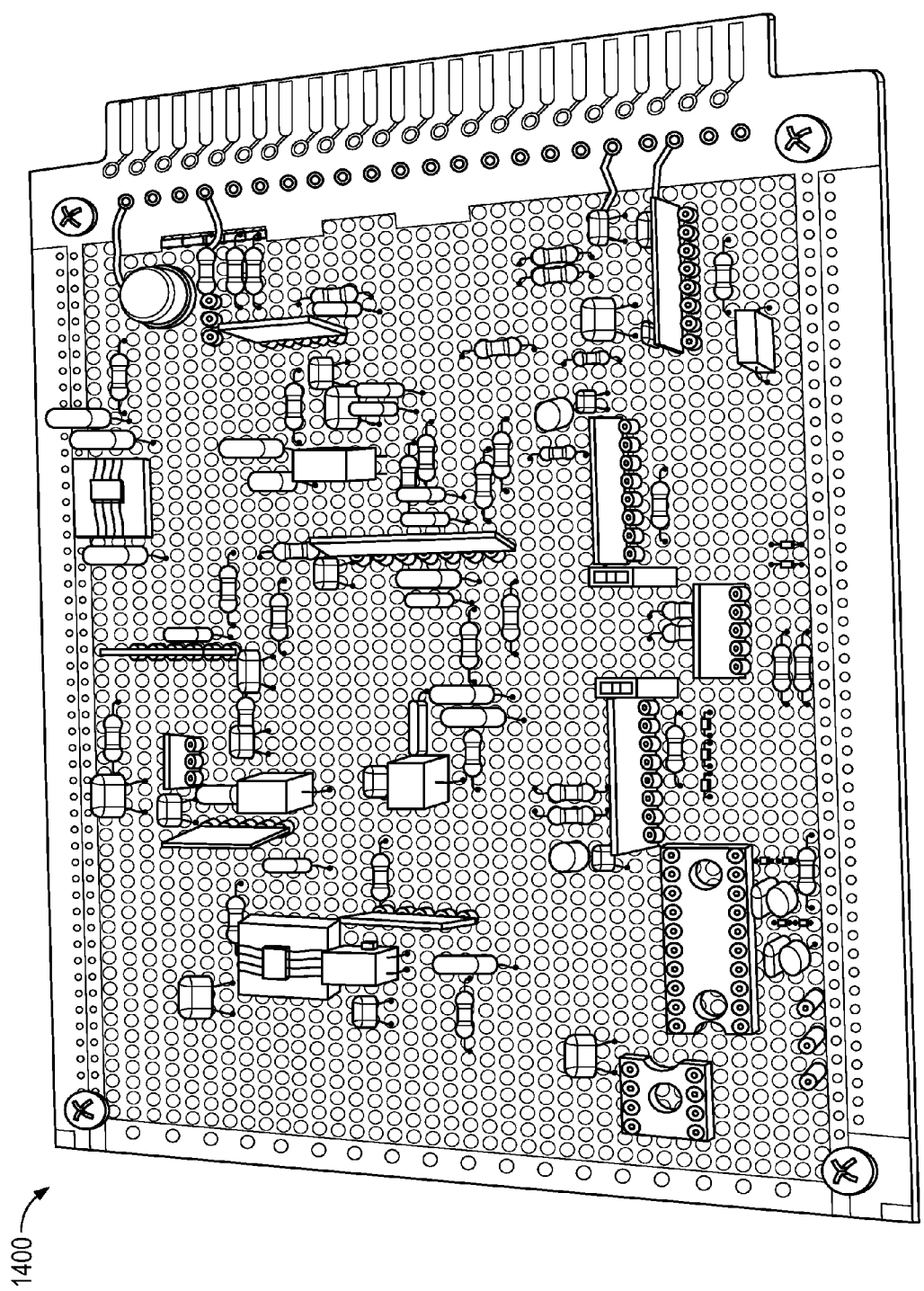
FIG. 14 is an image of a temperature sensor circuit to detect phase shifts in a lithium-ion cell and determine an internal temperature of the cell based on the phase shift.

FIG. 14 is an image of a temperature sensor circuit 1400 to detect phase shifts in a lithium-ion cell and determine an internal temperature of the cell based on the phase shift.

Circuit 1400 is designed for cells having a capacity within a range of at least 2 Ah to 51 Ah.

Circuit 1400 may perform a temperature measurement in approximately 200-millisecond, and may be implemented to monitor four cells in a battery pack through multiplexing in less than 1 second.

Circuit 140 may be powered by a monitored cell. Evaluations have shown that circuit 1400 drains 2.15 Ah a lithium-ion the cell at a rate of approximately 100-mA DC, for 200 milliseconds per measurement. This is equivalent to 5.5-μAh, which is a relatively miniscule amount of the cell's capacity. At this rate, internal temperature the cell may be determined more than 396,000 times. In other words, for a fully charged cell, $T_{anode}$ may be monitored continuously 550 hours.

As another metric, without circuit 1400, the 2.15 Ah cell may support a 3.6 Watt (W) load at the rate of constant C/2, or a 1.05 Amp current drain. Absent circuit 1400, the cell may support the 3.6 W load for approximately 120 minutes. Where circuit 1400 is powered by the cell and operates continuously, the cell may support the 3.6 W load and circuit 1400 for approximately 109 minutes.

The 11 minute difference may be a relatively small cost for continuous and accurate monitoring of the cell for sudden temperature changes.

Moreover, temperature may be determined or sampled periodically rather than continuously, which may reduce power consumption.

Circuit 1400 includes four-probes to connect to positive and negative terminals of a cell, such as described in examples above. Wire lengths between circuit 1400 and a cell do not affect the outcome of the measurement or operation of circuit 1400.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

One skilled in the art will recognize that these functional building blocks can be implemented by discrete components, application specific integrated circuits, processors executing appropriate software, and combinations thereof.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. A method of measuring an internal temperature of a lithium-ion rechargeable cell, comprising:
    applying an alternating signal to the cell to generate a phase-shifted alternating signal at the cell;
    detecting the phase shift as a phase difference between a frequency of the applied alternating signal and a frequency of the phase-shifted alternating signal; and
    determining the internal temperature of the cell based on the phase difference;
    wherein the applying includes one or more of applying an alternating current to generate a phase phase-shifted alternating voltage, and applying an alternating voltage to generate a phase phase-shifted alternating current.

2. The method of claim 1, wherein the frequency of the applied alternating signal is within a range of up to approximately 1000 Hertz (Hz).

3. The method of claim 2, wherein the frequency of the applied alternating signal is within a range of approximately 40 Hz to 100 Hz, and wherein the determining includes determining an internal anode temperature of the cell based on the phase difference.

4. The method of claim 2, wherein the frequency of the applied alternating signal is within a range of approximately 10 Hz to 20 Hz, and wherein the determining includes determining an internal cathode temperature of the cell based on the phase difference.

5. The method of claim 1, wherein:
    the applying includes applying first and second alternating signals to the cell to generate corresponding first and second phase-shifted alternating signals at the cell;
    the detecting includes detecting a first phase difference between a frequency of the first applied alternating signal and a frequency of the first phase-shifted alternating signal, and detecting a second phase difference between a frequency of the second applied alternating signal and a frequency of the second phase-shifted signal;
    the frequency of the first applied alternating signal is within a range of approximately 40 Hertz (Hz) to 100 Hz;
    the frequency of the second applied alternating signal is within a range of approximately 10 Hz to 20 Hz; and
    the determining includes determining an internal anode temperature of the cell based on the first phase difference, and determining an internal cathode temperature of the cell based on the second phase difference.

6. The method of claim 1, further including:
    isolating the cell from one or more of a charging circuit and a discharging circuit under one or more of the following conditions,
    the internal temperature of the cell exceeds a threshold temperature, and
    a rate of increase of the internal temperature of the cell meets or exceeds a threshold rate.

7. The method of claim 1, further including:
    performing the applying, the detecting, and the determining under one or more of the following conditions,
    while the cell is charging, and
    while the cell is discharging to a load.

8. The method of claim 1, wherein the determining includes retrieving an indication of the temperature from a look-up table based on the phase difference.

9. A system to measure an internal temperature of a lithium-ion rechargeable cell, comprising:
    an alternating signal source to apply an alternating signal to the cell to generate a phase-shifted alternating signal at the cell;
    a phase meter to detect the phase-shift as a phase difference between a frequency of the applied alternating signal and a frequency of the phase-shifted alternating signal; and
    a phase-to-temperature converter to determine the internal temperature of the cell based on the phase difference;
    wherein the alternating signal source includes one or more of an alternating current source to generate a phase-shifted alternating voltage, and an alternating voltage source to generate a phase-shifted alternating current.

10. The system of claim 9, wherein the alternating signal source is implemented to apply the alternating signal within a frequency range of up to approximately 1000 Hertz (Hz).

11. The system of claim 10, wherein the alternating signal source is implemented to apply the alternating signal within a frequency range of approximately 40 Hz to 100 Hz, and wherein the phase-to-temperature converter is implemented to determine an internal anode temperature of the cell based on the phase difference.

12. The system of claim 10, wherein the alternating signal source is implemented to apply the alternating signal with within a frequency range of approximately 10 Hz to 20 Hz, and wherein the phase-to-temperature converter is implemented to determine an internal cathode temperature of the cell based on the phase difference.

13. The system of claim 9, wherein:
    the alternating signal source includes first and second alternating signal sources to apply corresponding first and second alternating signals to the cell to generate corresponding first and second phase-shifted alternating signals at the cell;
    the phase meter is implemented to detect a first phase difference between a frequency of the first applied alternating signal and a frequency of the first phase-shifted alternating signal, and to detect a second phase difference between a frequency of the second applied alternating signal and a frequency of the second phase-shifted alternating signal;
    the first alternating signal source is implemented to generate the first alternating signal within a frequency range of approximately 30 Hertz (Hz) to 100 Hz;
    the second alternating signal source is implemented to generate the second alternating signal within a frequency range of approximately 10 Hertz (Hz) to 20 Hz; and the phase-to-temperature converter is implemented to determine an internal anode temperature of the cell based on the first phase difference, and an internal cathode temperature of the cell based on the second phase difference.

14. The system of claim 9, wherein the phase-to-temperature converter includes a look-up table of phase-to-temperature correlations.

15. The system of claim 9, further including:
a control system to isolate the cell from one or more of a charging circuit and a discharging circuit under one or more of the following conditions,
when the internal temperature of the cell exceeds a threshold temperature, and
when a rate of increase of the internal temperature of the cell meets or exceeds a threshold rate.

16. A method of correlating a phase delay of a rechargeable lithium-ion cell with an internal temperature of the cell, comprising:
applying an alternating signal to the cell when the internal temperature of the cell is at a first temperature to generate a phase-delayed alternating signal at the cell;
detecting a phase difference between a frequency of the applied alternating signal and a frequency of the phase-shifted alternating signal;
repeating the applying and the detecting for one or more additional internal temperatures of the cell;
correlating the phase differences with the temperatures; and
recording the correlations in a tangible medium;
wherein the applying includes one or more of applying an alternating current to generate a phase phase-shifted alternating voltage, and applying an alternating voltage to generate a phase phase-shifted alternating current.

17. The method of claim 16, further including:
performing the applying and the detecting under one or more of the following conditions,
while the cell is charging, and
while the cell is discharging to a load.

18. The method of claim 16, wherein the correlating includes:
correlating the phase differences with internal temperatures of the cell, for temperatures within a range of approximately −80° C. to 100° C.

19. The method of claim 16, wherein the frequency of the applied alternating signal is within a range of up to approximately 1000 Hertz (Hz).

20. The method of claim 19, wherein the frequency of the applied alternating signal is within a range of approximately 40 Hz to 100 Hz, and wherein the correlating includes correlating the phase differences with internal anode temperatures of the cell.

21. The method of claim 19, wherein the frequency of the applied alternating signal is within a range of approximately 10 Hz to 20 Hz, and wherein the correlating includes correlating the phase differences with internal cathode temperatures of the cell.

22. The method of claim 19, wherein:
the applying includes applying first and second alternating signals to the cell to generate corresponding first and second phase-shifted alternating signals at the cell;
the detecting includes detecting a first phase difference between a frequency of the first applied alternating signal and a frequency of the first phase-shifted alternating signal, and detecting a second phase difference between a frequency of the second applied alternating signal and a frequency of the second phase-shifted signal;
wherein the frequency of the first applied alternating signal is within a range of approximately 40 Hertz (Hz) to 100 Hz, and the frequency of the second applied alternating signal is within a range of approximately 10 Hz to 20 Hz; and
the correlating includes correlating the first phase differences with internal anode temperatures of the cell, and correlating the second phase differences with internal cathode temperatures of the cell.

23. A method of identifying a thermal condition of a lithium-ion cell, comprising:
applying an alternating signal to the cell to generate a phase-shifted alternating signal at the cell;
detecting the phase shift as a phase difference between a frequency of the applied alternating signal and a frequency of the phase-shifted alternating signal; and
initiating a pre-emptive action to prevent thermal runaway when a rate of change of the phase-difference meets or exceeds a threshold rate, wherein the applying and the detecting are performed continuously or periodically.

24. The method of claim 23, wherein the initiating includes:
isolating the cell from one or more of a charging circuit and a discharging circuit.

* * * * *